(12) United States Patent
Parfeniuk et al.

(10) Patent No.: US 6,797,362 B2
(45) Date of Patent: Sep. 28, 2004

(54) PHYSICAL VAPOR DEPOSITION TARGET CONSTRUCTIONS

(75) Inventors: Chris Parfeniuk, Spokane, WA (US); Tony Beier, Spokane, WA (US)

(73) Assignee: Honeywell International Inc., Morristown, NJ (US)

( * ) Notice: Subject to any disclaimer, the term of this patent is extended or adjusted under 35 U.S.C. 154(b) by 56 days.

(21) Appl. No.: 09/928,172

(22) Filed: Aug. 9, 2001

(65) Prior Publication Data

US 2002/0028538 A1 Mar. 7, 2002

Related U.S. Application Data

(62) Division of application No. 09/488,973, filed on Jan. 20, 2000.

(51) Int. Cl.[7] .......................... B32B 3/00; B32B 24/00; B32B 25/00

(52) U.S. Cl. ..................... 428/164; 428/165; 428/173.1

(58) Field of Search ................................. 428/164, 165, 428/173.1

(56) References Cited

U.S. PATENT DOCUMENTS

| | | | |
|---|---|---|---|
| 3,622,470 A | 11/1971 | Gowman | 219/79.2 |
| 3,758,741 A | 9/1973 | Holko et al. | 218/78.82 |
| 3,779,839 A | 12/1973 | Kaihu et al. | 228/207 |
| 4,025,036 A | 5/1977 | Melnyk | 228/193 |
| 4,029,253 A | 6/1977 | Cartossi | 228/175 |
| 4,046,305 A | 9/1977 | Brown et al. | 228/194 |
| 4,119,262 A | 10/1978 | Yen et al. | 228/206 |
| 4,300,031 A | 11/1981 | Reboux et al. | 219/617 |
| 4,352,450 A | 10/1982 | Edgington | 228/205 |
| 4,405,427 A | 9/1983 | Byrd | 285/50 |
| 4,420,385 A | 12/1983 | Hartsough | 204/192.23 |
| 4,469,757 A | 9/1984 | Ghosh et al. | 428/614 |
| 4,496,095 A | 1/1985 | Renshaw et al. | 228/102 |
| 4,732,312 A | 3/1988 | Kennedy et al. | 148/535 |

(List continued on next page.)

FOREIGN PATENT DOCUMENTS

| | | | |
|---|---|---|---|
| EP | 0 370 211 A2 A3 | 5/1990 | |
| EP | 0 575 166 A1 | 12/1993 | |
| EP | 0 590 904 | 4/1994 | ........... C23C/14/34 |
| EP | 0 630 423 B1 | 6/1998 | |
| EP | 0 881 311 A1 | 12/1998 | |
| GB | 2 241 914 A | 9/1991 | |
| JP | 6-65733 | 3/1994 | |
| JP | 6-226455 | 8/1994 | |
| JP | 9143704 | 6/1997 | |
| JP | 10 330928 | 12/1998 | |
| WO | WO 98/26107 | 6/1998 | |
| WO | US 01/ 01488 | 1/2001 | |
| WO | PCT/US01/07404 | 8/2001 | |

OTHER PUBLICATIONS

Davis, J.R., "ASM Specialty Handbook©—Aluminum and Aluminum Alloys", date unknown, p. 320.
Porter, David et al., "Phase Transformations in Metals and Alloys", date unknown, pp. 75–83.

Primary Examiner—W. David Coleman
Assistant Examiner—William M. Brewster
(74) Attorney, Agent, or Firm—Wells St. John P.S.

(57) ABSTRACT

The invention encompasses a method of bonding a first mass to a second mass. A first mass of first material and a second mass of second material are provided and joined in physical contact with one another. The first and second masses are then diffusion bonded to one another simultaneously with the development of grains of the second material in the second mass. The diffusion bonding comprises solid state diffusion between the first mass and the second mass. A predominate portion of the developed grains in the second material have a maximum dimension of less than 100 microns. The invention also encompasses methods of forming a physical vapor deposition target bonded to a backing plate.

20 Claims, 2 Drawing Sheets

U.S. PATENT DOCUMENTS

| | | | |
|---|---|---|---|
| 4,838,474 A | | 6/1989 | Ohashi et al. ............... 228/121 |
| 4,842,706 A | * | 6/1989 | Fukasawa et al. ..... 204/298.13 |
| 4,848,647 A | | 7/1989 | Gentry et al. ............ 228/262.5 |
| 4,905,886 A | | 3/1990 | Kennedy et al. ............ 228/194 |
| 4,978,054 A | | 12/1990 | Ferrando et al. ............ 228/194 |
| 5,009,765 A | | 4/1991 | Qamar et al. .......... 204/298.12 |
| 5,102,033 A | | 4/1992 | Woods et al. .......... 228/262.51 |
| 5,143,590 A | | 9/1992 | Strothers et al. ....... 207/298.12 |
| 5,230,459 A | | 7/1993 | Mueller et al. ............. 228/164 |
| 5,268,236 A | | 12/1993 | Dumont et al. ............. 428/636 |
| 5,342,496 A | | 8/1994 | Stellrecht ............... 204/298.12 |
| 5,590,389 A | * | 12/1996 | Dunlop et al. ................ 419/67 |
| 5,599,467 A | | 2/1997 | Okabe et al. ................ 219/118 |
| 5,693,203 A | | 12/1997 | Ohhashi et al. ........ 204/293.12 |
| 5,799,860 A | | 9/1998 | Demaray et al. ........... 228/194 |
| 5,807,443 A | | 9/1998 | Masuda et al. ............. 148/535 |
| 5,836,506 A | * | 11/1998 | Hunt et al. ................. 228/172 |
| 5,938,103 A | | 8/1999 | Hill et al. ................... 228/115 |
| 6,071,389 A | | 6/2000 | Zhang ................... 284/298.12 |
| 6,073,830 A | * | 6/2000 | Hunt et al. ................. 228/203 |
| 6,085,966 A | | 7/2000 | Shimomuki et al. ........ 228/193 |
| 6,164,519 A | | 12/2000 | Gilman et al. ............. 228/107 |
| 6,199,259 B1 | | 3/2001 | Demaray et al. ............. 29/458 |
| 6,227,432 B1 | | 5/2001 | Enomoto et al. ........ 228/112.1 |
| 6,274,015 B1 | | 8/2001 | Beier et al. ............ 204/298.12 |
| 6,391,465 B1 | | 5/2002 | Zheng et al. ............... 428/450 |
| 6,555,250 B2 | | 4/2003 | Shah et al. ................. 428/652 |
| 6,579,431 B1 | * | 6/2003 | Bolcavage et al. .... 204/298.13 |
| 2002/0003010 A1 | | 1/2002 | Shah et al. ................... 148/17 |
| 2002/0174917 A1 | | 11/2002 | Segal et al. ................. 148/437 |

\* cited by examiner

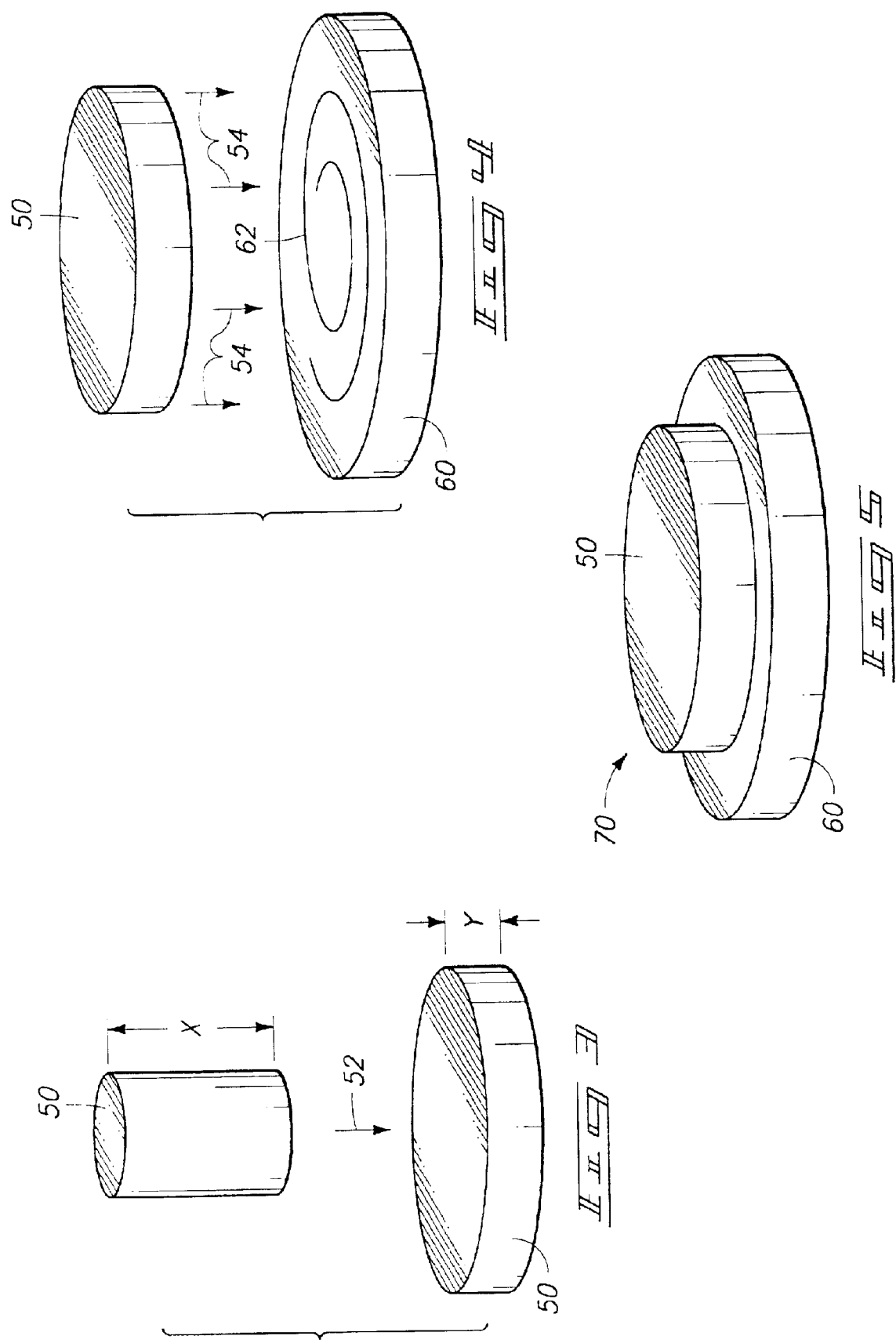

PHYSICAL VAPOR DEPOSITION TARGET CONSTRUCTIONS

RELATED PATENT DATA

This patent resulted from a divisional application of U.S. patent application Ser. No. 09/488,973, which was filed on Jan. 20, 2000.

TECHNICAL FIELD

The invention pertains to methods of bonding first and second masses to one another, and in particular embodiments, pertains to methods of bonding two similar materials together, as well as to methods of bonding physical vapor deposition target materials to backing plate materials.

BACKGROUND OF THE INVENTION

There are numerous applications in which it is desired to bond a first mass to a second mass. One such application is in the bonding of physical vapor deposition targets (such as, for example, sputtering targets) to backing plates. The backing plates are configured to retain the targets in particular locations and orientations within pressure vapor deposition apparatuses.

Modern developments in physical vapor deposition methodologies have created increasingly stringent requirements for robust bonding between targets and backing plates. A diagrammatic view of a portion of an exemplary sputter deposition apparatus 10 is shown in FIG. 1. Apparatus 10 comprises a backing plate 12 having a sputtering target 14 bonded thereto. A semiconductive material wafer 16 is within apparatus 10 and provided to be spaced from target 14. Sputtered material 18 is displaced from target 14 and utilized to form a coating (not shown) over wafer 16.

Among the modern improvements in sputter design is an increase in the distance between target 14 and semiconductive material substrate 16. Such increase in distance can enable more directional sputtering to be achieved over features of substrate 16 than can be achieved when target 14 is close to substrate 16 by allowing atoms that are not moving perpendicular to substrate 16 to land on the sidewall of the sputtering chamber. Specifically, substrate 16 will frequently have vertical holes or slots (known as vias) with depths five times their width or more (i.e., having relatively high critical dimensions). It is difficult to sputter materials into vias having high critical dimensions unless there is a relatively long throw between a sputtering target and a substrate comprising the vias.

Although the longer throw creates advantages in coverage relative to shorter throw techniques, it also creates complications. One of such complications is caused by additional power utilized in long-throw technologies. The additional power can cause sputtering targets to get hotter than they had in older methods. Such heat can disrupt a bond formed between backing plate 12 and target 14. For instance, if target 14 is solder-bonded to backing plate 12, the heat developed during long-throw sputtering techniques can be sufficient to melt the solder bond and actually break target 14 free from backing plate 12. Accordingly, solder-bonding can be inappropriate for long-throw sputtering techniques.

A type of bonding which is generally able to withstand the high temperatures utilized in long-throw sputtering techniques is diffusion bonding, which is a bond formed by solid state diffusion of components from target 14 to backing plate 12 and/or vice versa. A difficulty in using diffusion bonding is that such typically comprises relatively high temperatures (300° C. or more) to form the bond, and such temperatures can adversely affect target materials. Accordingly, it can be difficult to develop diffusion bonding processes for bonding physical vapor deposition targets to backing plates, and which further retain desirable properties of the physical vapor deposition targets. It would be desirable to develop such diffusion bonding processes.

SUMMARY OF THE INVENTION

In one aspect, the invention encompasses a method of bonding a first mass to a second mass. A first mass of first material and a second mass of second material are provided and joined in physical contact with one another. The first and second masses are then diffusion bonded to one another simultaneously with the development of grains of the second material in the second mass. The diffusion bonding comprises solid state diffusion between the first mass and the second mass. A predominate portion of the developed grains in the second material have a maximum dimension of less than 100 microns.

In another aspect, the invention encompasses a method of forming a physical vapor deposition target bonded to a backing plate. A target material and a backing plate material are joined in physical contact with one another. The target material and backing plate material both comprise aluminum. The joined target and backing plate materials are thermally treated under an atmosphere which is inert relative to forming oxides on the target and backing plate materials. The thermal treatment simultaneously diffusion bonds the target material to the backing plate material while recrystallizing grains in the target material. The diffusion bonding comprises solid state diffusion between the backing plate material and the target material to adhere the target material to the backing plate material with a bond strength of at least 5,000 pounds/inch$^2$. A predominate portion of the grains developed in the target material are less than 100 microns in maximum dimension after the thermal treatment of the target and backing plate materials.

BRIEF DESCRIPTION OF THE DRAWINGS

Preferred embodiments of the invention are described below with reference to the following accompanying drawings.

FIG. 3 is a diagrammatic illustration of a method of introducing work hardening into a target material.

FIG. 4 is a diagrammatic illustration of the target material of FIG. 3 with a backing plate at a preliminary bonding step.

FIG. 5 is a diagrammatic view of the target material and backing plate of FIG. 4 at a bonding step subsequent to that of FIG. 4.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

The invention encompasses methods of bonding materials to one another, and in particular embodiments encompasses methods of bonding a physical vapor deposition target material to a backing plate material.

One aspect of the invention is a recognition that it would be advantageous to develop methodologies for diffusion bonding an aluminum-containing target to an aluminum-containing backing plate, while achieving relatively small grain sizes in the target material. A difficulty associated with diffusion bonding of aluminum-containing targets to aluminum-containing backing plates is that the diffusion-bonding temperatures can cause growth of crystalline grains (actually polycrystalline grains) in the aluminum targets. It is generally desired that aluminum grains remain relatively small (i.e., less than 100 microns, and more preferably less than 50 microns) in targets comprising high purity aluminum (e.g., elemental aluminum), and aluminum alloys. The smaller grains can improve sputtering processes in which aluminum is sputtered from the target material relative to sputtering occurring from a target material having larger grains.

The invention encompasses methodology for controlling grain growth associated with the diffusion bonding of aluminum. Such methodology can form a diffusion bonded aluminum sputtering target in which a predominate portion of the grains in the target material have a maximum grain size of less than 100 microns.

Figure 1:
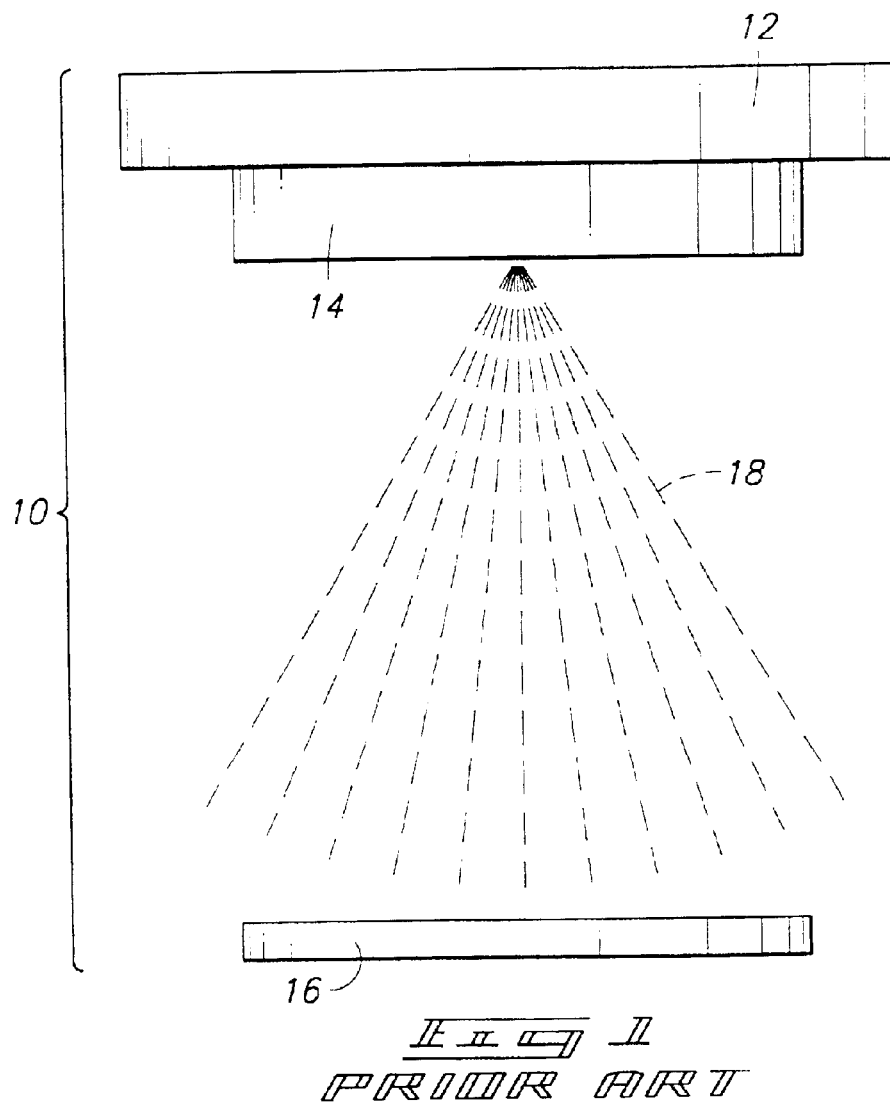
FIG. 1 is a diagrammatic view of a portion of a prior art sputter deposition apparatus.
Figure 2:
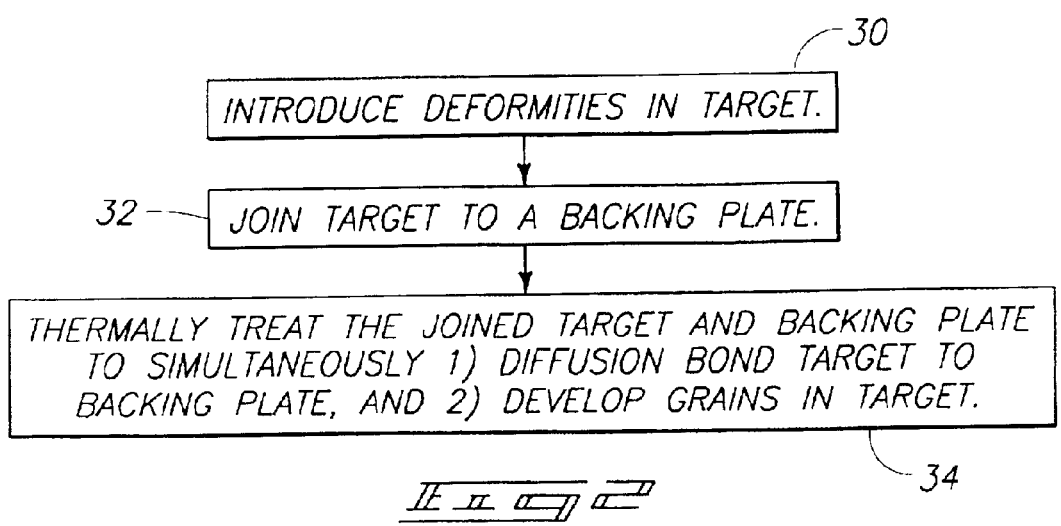
FIG. 2 is a flow chart diagram of a method encompassed by the present invention.

A method encompassed by the present invention described by a flow diagram in FIG. 2. At an initial step (labeled 30 in FIG. 2) work hardening is done to a target material. If, for example, the target material comprises aluminum, work hardening can be introduced by compressing the aluminum from an initial thickness a second thickness. Such compression is illustrated in FIG. 3, wherein a target 50 is illustrated before and after compression, with an arrow 52 provided to indicate the step of compression. Target 50 comprises a first thickness "X" prior to the compression 52 and a second thickness "Y" after the compression. The compression can be accomplished by, for example, cold forging or cold rolling The final thickness of target 50 ("Y") can be, for example, less than 2% of the initial thickness of target 50 (i.e., a 98% compression), and is typically less than or equal to about 40% of the initial thickness of target 50 (i.e., a 60% compression). In particular embodiments, target 50 can be subjected to a 95% compression (i.e., compressed so that final thickness "Y" is about 5% of initial thickness "X").

Target 50 can, for example, comprise or consist essentially of low to high purity aluminum. An exemplary commercial (low-purity) aluminum that can be utilized for target 50 is 1100 series aluminum alloy. The material of target 50 can be cast as a billet having a diameter of from about 4 inches to about 9 inches, and having an initial thickness of from about 5 inches to about 10 inches. After the compression of target 50, the resulting cold-worked blank can be cut to form a round blank of a desired diameter.

Referring again to the flow chart of FIG. 2, the target is joined to a backing plate (FIG. 2, step 32). Preferably, the target and backing plate are cleaned prior to joining them to remove contaminants that may be present. A method of joining a target to a backing plate is described with reference to FIGS. 4 and 5. Referring to FIG. 4, the work-hardened target 50 of FIG. 3 is shown elevated above a backing plate 60. Backing plate 60 of FIG. 3 is shown having a continuous channel 62 machined into a surface in a spiral pattern. Ultimately, target 50 will be pressed against plate 60 to force material from target 50 into channel 62.

In embodiments in which target 50 comprises high-purity aluminum, backing plate 60 can also comprise aluminum, and can specifically comprise, for example, 2000 Series, 5000 Series, 6000 Series or 7000 Series heat-treatable aluminum alloys. In particular embodiments, backing plate 60 can comprise heat-treatable aluminum alloy 6061 in either a T4 or T6 precipitate hardened condition.

An initial step in bonding target 50 to backing plate 60 is typically to join the target and backing plate by physically contact target 50 with plate 60. Arrows 54 of FIG. 4 indicate such joining by showing that target 50 is lowered onto plate 60. FIG. 5 shows an assembly 70 comprising target 50 joined to plate 60. In the shown assembly 70, target 50 covers channel 62 (FIG. 4) of backing plate 60. Although the shown embodiment has a channel formed in backing plate 60 to enhance coupling of target 50 to backing plate 60, it is to be understood that such channel can be eliminated in particular embodiments of the invention, or can be provided in target 50, rather than in backing plate 60. In embodiments in which one of backing plate 60 and target 50 is harder than another of backing plate 60 and target 50, channel 62 will preferably be provided in the harder of the two, so that the softer of the two can be pressed into the channel in subsequent processing.

Assembly 70 can be formed in, or placed in, an atmosphere which is inert relative to oxide formation from materials of plate 60 and target 50. In embodiments in which plate 60 and target 50 comprise high-purity aluminum, or aluminum alloys, the inert atmosphere can comprise a vacuum, or consist essentially of, for example, one or more of nitrogen gas and argon gas. The inert atmosphere preferably does not comprise oxidative components (like oxygen), as such could adversely cause oxidation of the materials of one or both of the blank 60 and target 50.

Referring again to the flow chart of FIG. 2, the joined backing plate and target are thermally treated (step 34 of FIG. 2) to simultaneously 1) diffusion bond the target to the backing plate, and 2) develop grains in the target. If target 50 and backing plate 60 comprise high-purity aluminum, the thermal treatment can comprise, for example, heating the joined target and backing plate to a temperature of between 280° C. and 400° C. (preferably between 300° C. and 340° C.), and maintaining such temperature for a time of from about 15 minutes to about an hour. During the time that the temperature is maintained, target 50 and backing plate 60 can be compressed in a forge to pressure of from about 10,000 pounds per square inch (psi) to about 16,000 psi.

An exemplary thermal treatment procedure for treating a target and backing plate which comprise aluminum is as follows. Initially, an assembly comprising a target joined against a backing plate is heated to a temperature of from about 280° C. to about 400° C. (preferably form about 300° C. to about 350° C., and more preferably from about 300° C. to about 344° C.) and maintained at such temperature for a time of from 15 to 30 minutes. The assembly is then transferred to a forge which is also maintained at a temperature of from about 280° C. to about 400° C. The forge is utilized to compress target 50 and backing plate 60 together to a pressure of from about 10,000 psi to about 16,000 psi. After compressing the target and backing plate, the assembly is transferred back to the furnace having a temperature of from about 280° C. to about 400° C., and maintained at such temperature for an additional time of from about 10 minutes to about 30 minutes.

The above-described exemplary method allows diffusion bonding (specifically, solid state diffusion of aluminum between target 50 and backing plate 60), as well as development of grains within target 50. Such grains form due to cold work introduced in target 50 during the compression of FIG. 3. The grain development typically involves three distinct steps. First, recovery in which stresses are relieved from in the most severely deformed regions. Second, the cold-worked grains recrystallize forming small, new, stress-free grains in target 50, and finally grain growth of the new grains occurs. Preferably, target 50 is not exposed to a temperature above about 280° C. from the time it is work-hardened in the step of FIG. 3, until it is exposed to the thermal treatment. Accordingly, substantially an entirety of the grain development of target 50 occurs during the thermal treatment of target 50 and backing plate 60. The phrase "substantial entirety" is utilized in referring to the recrystallization and grain growth occurring during the thermal treatment, rather than stating an "entirety" of the recrystallization and grain growth to indicate that there may be a small and effectively inconsequential amount of recrystallization and grain growth occurring at temperatures below 280° C. during processing and cleaning of target 50 prior to the thermal treatment.

A particular process for accomplishing the above-discussed thermal treatment method is to place the assembly of the target and backing plate in a can (for instance, a can made of thin-walled aluminum), and to retain the assembly in the can during the heating and forging (i.e., pressing) associated with the diffusion bonding. The can preferably comprises two parts, and a wide flange which allows for subsequent welding to seal the target and backing plate assembly in the can. Also, the can preferably has a small diameter tube which allows for vacuum checking of a weld seal on the can, as well as for providing a vacuum or inert atmosphere inside the can. Once the target and backing plate assembly is provided in the can, the can is welded shut. An inert gas or vacuum can be utilized during the welding to alleviate oxidation of the target and backing plate assembly. Weld integrity can be determined by conducting a leak test using the small diameter tube. A final weld can be done on the small diameter tube to allow a vacuum or inert gas atmosphere to be maintained in the can. During the time that the target and backing plate assembly is subjected to diffusion bonding, a temperature of the assembly can be monitored indirectly by monitoring the temperature of a so-called dummy part having the same dimensions as the target and backing plate assembly, and heated in either the same furnace as the assembly, or in an identical furnace.

After the thermal treatment of the target and backing plate assembly, such assembly is cooled. The cooling can be accomplished by exposing the assembly to either a liquid or a gas, with an exemplary liquid being water, and an exemplary gas being air.

The methods discussed above can form a target and backing plate assembly 70 comprising a strong diffusion bond between target 50 and backing plate 60, with a tensile strength of such bond being at least 5,000 psi, and typically being between about 8,000 psi and 10,000 psi. The yield strength of fully recrystallized high purity aluminum is 3,000 psi, which is about equivalent to 20 megapascals (MPa) and the ultimate tensile strength is 12 ksi (81 MPa). The yield strength of 6061 T4 is 21 ksi (145 MPa), and the ultimate tensile strength of 6061 T4 is approximately 35 ksi (241 MPa).

The diffusion bond can have a strength close to that of the ultimate tensile strength of high purity aluminum, with the bond frequently having a strength of from about 68.5% to about 83% of the tensile strength of the high purity aluminum utilized in the target (typically from about 8230 psi to about 9948 psi at room temperature). In contrast, solder bonds typically have strength ranges from about 1470 psi to about 6740 psi. Bonds formed by methods of the present invention can therefore be significantly stronger than solder bonds, and accordingly, better suited for the long-throw target applications of modern sputtering applications that were discussed in the "Background" section of this disclosure.

The backing plate preferably remains strong after the above-discussed diffusion bonding. In a particular embodiment, a 6061 backing plate was found to retain a minimum strength equal to 6061-T4 when subjected to diffusion bonding at a temperature of about 300° C.

In addition to the strong bond formed between target 50 and backing plate 60 of assembly 70, a grain size of target 50 is preferably below 100 microns, more preferably from about 30 to less than 100 microns, and more preferably below about 50 microns after the diffusion bonding. Specifically, a predominate portion (i.e., more than 50%) of the grains in target 50 will preferably have a maximum dimension of less than 100 microns, more preferably from about 30 microns to less than 100 microns, and more preferably less than about 50 microns. In particular embodiments, an entirety of the grains in target 50 have a maximum dimension of less than 100 microns, more preferably from about 30 microns to less than 100 microns, and more preferably less than about 50 microns.

The above-discussed small grain size can be accomplished by starting with a target which been cold-worked, but which does not have grains formed. Accordingly, a recrystallization process will occur in the target material prior to growth of grains. For aluminum, such recrystallization process typically takes from about 20 to 30 minutes at a temperature of between 288° C. and about 316° C. Thus, a target will spend a significant amount of time that it is at a diffusion bonding temperature in a stage where grains are recrystallizing, rather than growing. Such can prevent the grains from over-growing during the diffusion bonding to sizes that are, for example, in excess of 100 microns.

Experiments have been performed to determine if increases in processing temperatures or times improve bonding of targets to backing plates. It is found that if a target is treated with higher temperatures or longer times, dramatic increases in grain size can occur, but only minor increases in bond strength are found.

It is to be understood that although several of the particular aspects described above pertain to first and second masses comprising aluminum, the invention can be utilized with masses other than those comprising aluminum. It is preferred that the masses comprise a component in common to enable diffusion bonding between the masses. Specifically, if the masses comprise a component in common, then the component can diffuse as a solid from one of the masses to another of the masses. The first and second masses can also comprise no common components, but diffusion between materials having the same component (known as self-diffusion) is typically faster than diffusion between materials comprising only dissimilar components. In particular embodiments, the masses will comprise an element in common, such as, for example, elemental aluminum.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A physical vapor deposition target construction comprising:
   a physical vapor deposition target consisting of high purity aluminum material;
   an backing plate consisting of aluminum;
   a diffusion bond between the target and backing plate;
   wherein a predominate portion of the grains in the target material are less than 100 microns in maximum dimension; and
   wherein the construction is formed utilizing a process comprising the following steps in the following order:
   the target material is subjected to at least 95% compression; and
   the target material is diffusion bonded to the backing plate under conditions which include a temperature of from 300° C. to 340° C. and a pressure of from about 10,000 psi to about 16,000 psi, with such conditions being maintained for a time of from about 15 minutes to about 1 hour.

2. The physical vapor deposition target construction of claim 1 wherein all of the grains in the target material have the maximum dimension of the less than 100 microns.

3. The physical vapor deposition target construction of claim 1 wherein the maximum dimension of the predominate portion of the grains in the target material is less than or equal to about 50 microns.

4. The physical vapor deposition target construction of claim 1 wherein the maximum dimension of all of the grains in the target material is less than or equal to about 50 microns.

5. The physical vapor deposition target construction of claim 1 wherein the maximum dimension of the predominate portion of the grains in the target material is from about 30 microns to less than 100 microns.

6. The physical vapor deposition target construction of claim 1 wherein the maximum dimension of all of the grains in the target material is from about 30 microns to less than 100 microns.

7. The physical vapor deposition target construction of claim 1 wherein the diffusion bond between the target and the backing plate has a bond strength of at least about 5000 psi.

8. The physical vapor deposition target construction of claim 7 wherein all of the grains in the target material have the maximum dimension of the less than 100 microns.

9. The physical vapor deposition target construction of claim 7 wherein the maximum dimension of the predominate portion of the grains in the target material is less than or equal to about 50 microns.

10. The physical vapor deposition target construction of claim 7 wherein the maximum dimension of all of the grains in the target material is less than or equal to about 50 microns.

11. The physical vapor deposition target construction of claim 7 wherein the maximum dimension of the predominate portion of the grains in the target material is from about 30 microns to less than 100 microns.

12. The physical vapor deposition target construction of claim 7 wherein the maximum dimension of all of the grains in the target material is from about 30 microns to less than 100 microns.

13. The physical vapor deposition target construction of claim 1 wherein the diffusion bond between the target and the backing plate has a bond strength of from about 8000 psi to about 10,000 psi.

14. A Physical vapor deposition target assembly comprising:
   a target comprising an aluminum material, having a sputtering surface and an opposing back surface;
   an aluminum-comprising backing plate having a continuous spiral channel disposed within a target-interface surface; and
   a diffusion bond between the back surface of the target and the target-interfacing surface of the backing plate, aluminum material from the target being disposed within the continuous spiral groove of the backing plate.

15. The physical vapor deposition target assembly of claim 14 wherein the backing plate comprises a material selected from the group consisting of 2000 Series aluminum, 5000 Series aluminum, 6000 Series aluminum, and 7000 Series aluminum.

16. The physical vapor deposition target assembly of claim 14 wherein the backing plate comprises 6061 aluminum alloy.

17. The physical vapor deposition target assembly of claim 14 wherein the target consists essentially of aluminum.

18. The physical vapor deposition target assembly of claim 14 wherein the maximum dimension of all of the grains in the aluminum material of the target is from about 30 microns to less than 100 microns.

19. A Physical vapor deposition target assembly comprising:
   an aluminum-comprising target having a sputtering surface and an opposing back surface, a continuous spiral channel disposed within the back surface;
   an backing plate comprising an aluminum material and having a target-interface surface; and
   a diffusion bond between the back surface of the target and the target-interfacing surface of the backing plate, aluminum material from the backing plate being disposed within the continuous spiral groove of the target.

20. The physical vapor deposition target assembly of claim 19 wherein the maximum dimension of all of the grains in the target is from about 30 microns to less than 100 microns.

* * * * *